(12) United States Patent
Busatta

(10) Patent No.: US 8,070,400 B2
(45) Date of Patent: Dec. 6, 2011

(54) DEVICE FOR THE HIGH-SPEED DRILLING OF PRINTED CIRCUIT BOARDS

(75) Inventor: Gioachino Busatta, Bassano del Grappa (IT)

(73) Assignee: LG Technologies s.r.l., Longarone (IT)

( * ) Notice: Subject to any disclaimer, the term of this patent is extended or adjusted under 35 U.S.C. 154(b) by 891 days.

(21) Appl. No.: 12/084,333

(22) PCT Filed: Oct. 27, 2006

(86) PCT No.: PCT/IT2006/000761
§ 371 (c)(1),
(2), (4) Date: Apr. 28, 2008

(87) PCT Pub. No.: WO2007/049325
PCT Pub. Date: May 3, 2007

(65) Prior Publication Data
US 2009/0151968 A1   Jun. 18, 2009

(30) Foreign Application Priority Data
Oct. 28, 2005 (IT) .............................. PD2005A0322

(51) Int. Cl.
*B23B 47/08* (2006.01)
(52) U.S. Cl. ............. 409/231; 408/9; 408/130; 408/702
(58) Field of Classification Search .......... 409/231–233; 408/8–12, 124, 129, 130, 702; 279/131
See application file for complete search history.

(56) References Cited

U.S. PATENT DOCUMENTS

| | | | | |
|---|---|---|---|---|
| 2,433,874 A * | 1/1948 | Varian | ................................ | 173/5 |
| 3,124,979 A * | 3/1964 | Macks | ........................... | 173/148 |
| 3,573,876 A * | 4/1971 | Powell | ........................... | 279/131 |
| 3,663,114 A | 5/1972 | Welsh et al. | | |
| 3,677,351 A * | 7/1972 | Geissler | ........................ | 173/198 |
| 3,837,661 A * | 9/1974 | Phillippi | ........................ | 279/131 |
| 4,017,203 A * | 4/1977 | Marantette et al. | ........... | 408/240 |
| 4,397,074 A | 8/1983 | Thornton et al. | | |
| 5,020,968 A * | 6/1991 | Yamada et al. | ................. | 415/36 |
| 5,024,562 A | 6/1991 | Arai et al. | | |
| 5,087,156 A | 2/1992 | Kanaya et al. | | |

FOREIGN PATENT DOCUMENTS

| | | |
|---|---|---|
| EP | 0 509 188 | 10/1992 |
| EP | 1 184 131 | 3/2002 |
| JP | 56062707 A * | 5/1981 |

* cited by examiner

*Primary Examiner* — Daniel Howell
(74) *Attorney, Agent, or Firm* — Stradley Ronon Stevens & Young, LLP

(57) ABSTRACT

A device for the high-speed drilling of boards for printed circuits and the like. The device has a support, a drill head with an associated mandrel, and a member for locking and driving a drill bit in the mandrel. The mandrel is actuated by a compressed air turbine and has an optical encoder for encoding the speed of rotation of the turbine and generating a signal representing this speed. The signal is supplied to a control circuit in order to drive a proportional valve supplying compressed air to the turbine as a function of the speed of rotation encoded by the optical encoder.

19 Claims, 4 Drawing Sheets

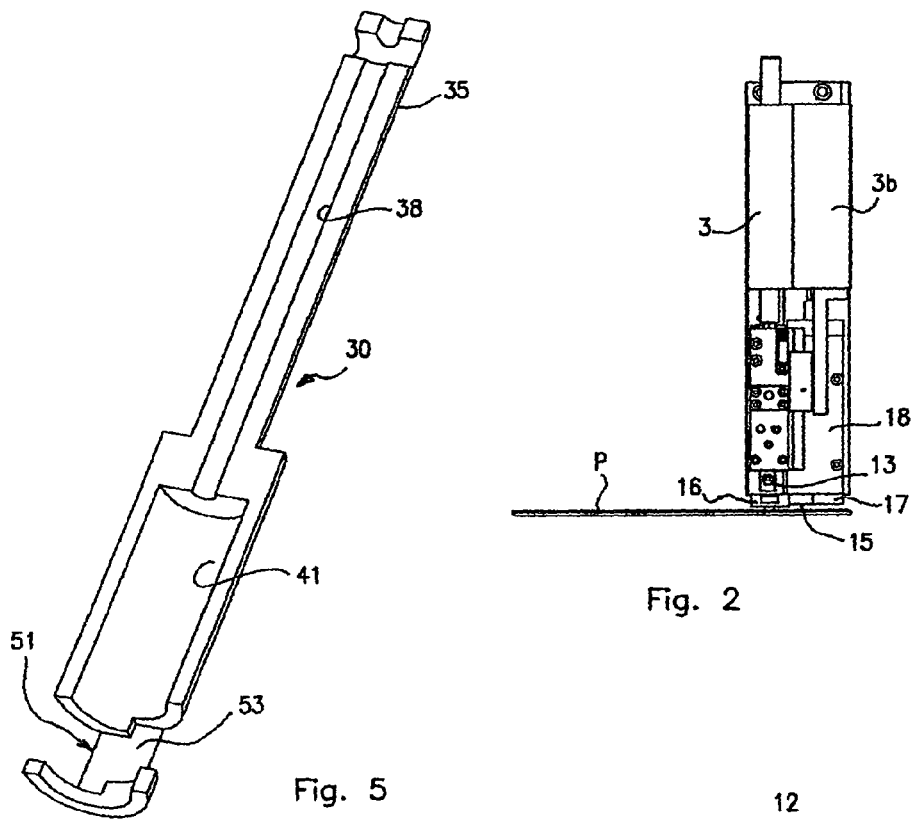
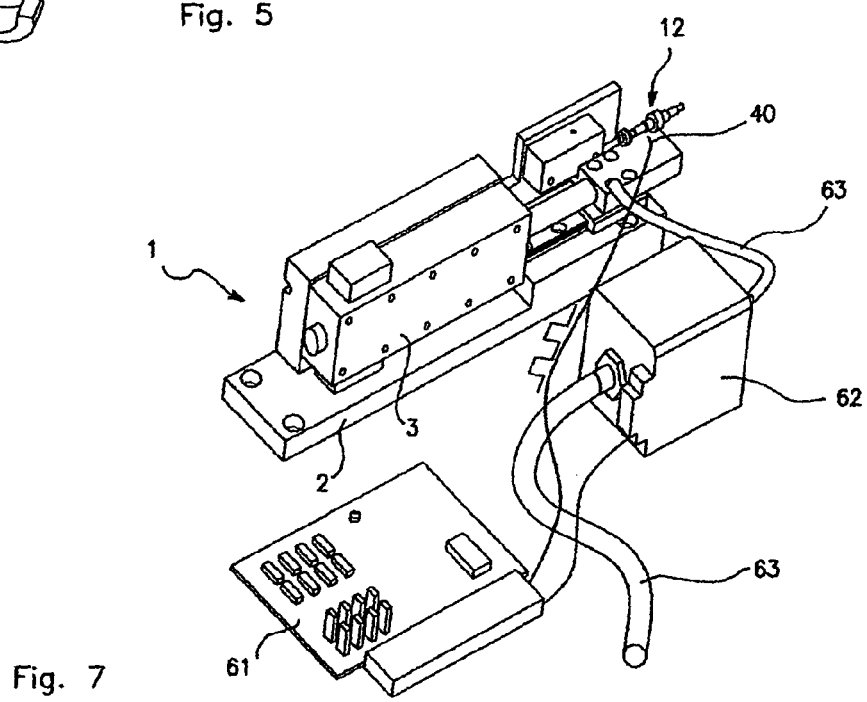

DEVICE FOR THE HIGH-SPEED DRILLING OF PRINTED CIRCUIT BOARDS

RELATED APPLICATION

This application is a U.S. national phase application of International Application No. PCT/IT2006/000761 filed on Oct. 27, 2006.

The present invention relates to a device for the high-speed drilling of boards for printed circuits and the like.

TECHNICAL FIELD

When machining boards for printed circuits, the board has to be drilled in at least some of the zones of interconnection of the tracks and welding of the circuit components.

TECHNOLOGICAL BACKGROUND

The current trend is towards an ongoing increase in the density of holes per unit of area and a reduction of their diameter. For this purpose, use is generally made of devices which have high-speed mandrels adapted to drive special drill bits in rotation using, for instance, compressed air turbines.

Bearing in mind the speeds involved (the device of the invention is adapted to enable more than 20 holes to be drilled per second), even apparently small mass displacements become a critical factor.

The drilling devices used up to now do not take appropriate account of this critical factor and have thus played their part in limiting the maximum drilling speed that has up to now been practicable. At present, no more than eight holes per second can be drilled with the fastest devices, which is far from market requirements in terms of the economic machining of the boards in question.

SUMMARY OF THE INVENTION

In the light of the above, the technical problem underlying the present invention is that of providing a drilling device for printed circuit boards which is structurally and functionally designed to enable the limits of the conventional devices to be remedied.

In the context of this problem, the main object of the present invention is to provide a drilling device which substantially reduces the masses subject to acceleration during the various drilling phases.

This problem is resolved and this and other objects are achieved by a drilling device embodied in accordance with the present invention. The device has a support and a drill head mounted on the support with an associated mandrel and a member for locking and driving the drill bit in the mandrel. In one embodiment, the device further has a compressed air turbine actuating the mandrel and rotating to define the drilling speed; an optical encoder for encoding the speed of rotation of the turbine and generating a signal representing this speed; and a control circuit receiving the signal from the optical encoder and driving a proportional valve. The proportional valve supplies compressed air to the turbine as a function of the speed of rotation encoded by the optical encoder.

In another embodiment, the mandrel of the device has a core shaft with a free end and a first tang, and a tubular member with facing windows each having a base. The member for locking and driving the drill bit has a second tang, and includes: (i) a pair of rings each having outer jacket portions received in the tubular member and a planar surface and an opposing surface having a planar section and an inclined planar section and a central hole adapted to receive the second tang of the drill bit, and (ii) a seat for the rings obtained at the free end of the core shaft of the mandrel and comprising two juxtaposed annular formations facing one another and interconnected by respective leveled portions and having respective shoulders projecting in a stepped manner towards one another but offset diametrically. The windows have an axial amplitude such as to contain the axial bulk of the rings when bearing on one another with the respective planar sections, leaving, on the side corresponding to these planar sections, an axial play such that the rings are compressed between the shoulder and the opposing base of the corresponding window.

It is to be understood that both the foregoing general description and the following detailed description are exemplary, but are not restrictive, of the invention.

BRIEF DESCRIPTION OF THE DRAWINGS

The characteristic features and advantages of the invention are set out in the following detailed description of preferred embodiments thereof, shown by way of non-limiting example in the accompanying drawings, in which:

FIG. 2 is a front elevation of the device of FIG. 1;

FIG. 5 is a perspective view, in section, of a detail of the device of FIG. 3;

FIG. 7 is a diagrammatic perspective view of the device of FIG. 1 and its electronic control.

PREFERRED EMBODIMENTS OF THE INVENTION

Figure 1:
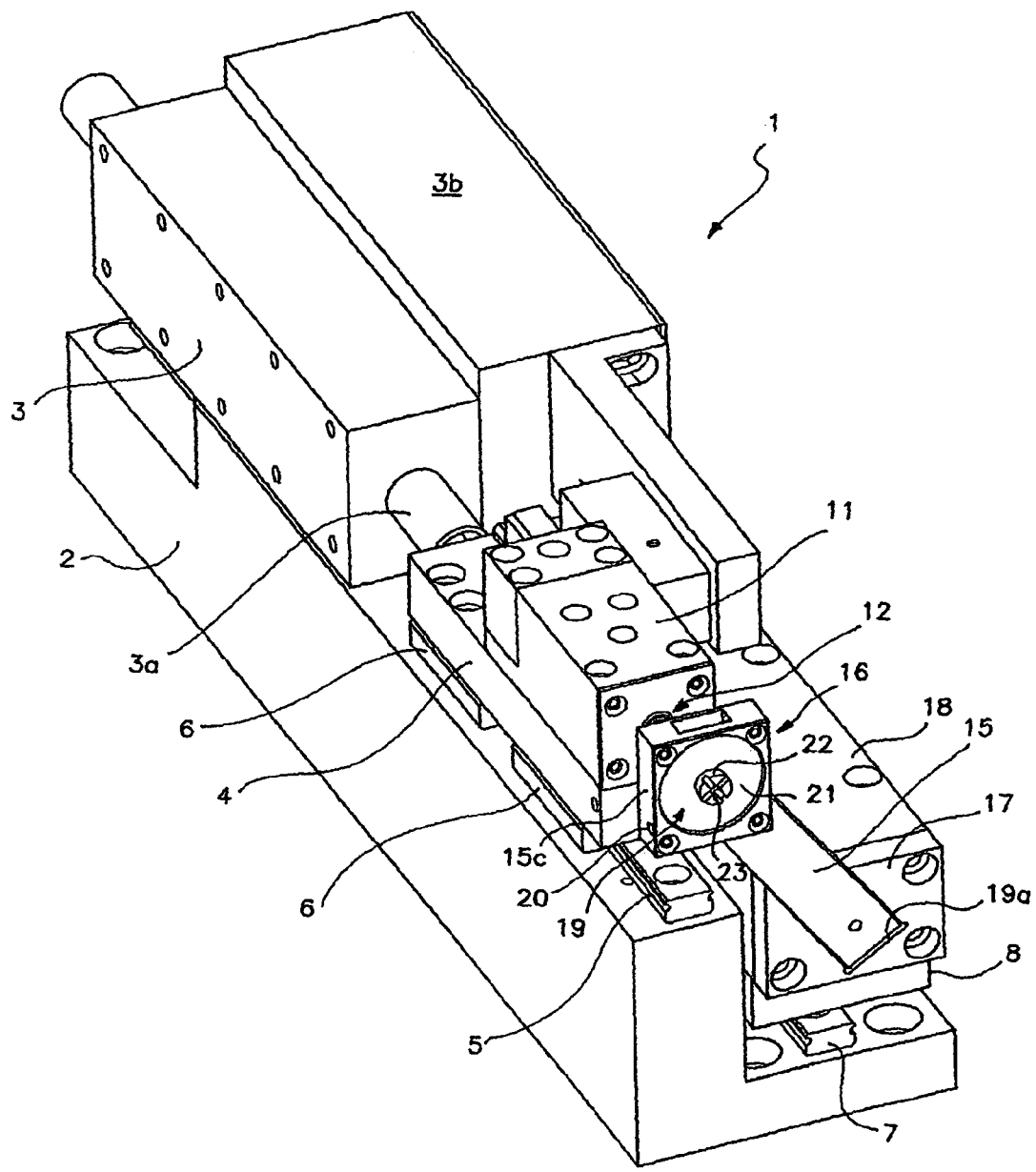
FIG. 1 is a perspective view, in longitudinal section, of a device for the high-speed drilling of printed circuits embodied in accordance with an embodiment of the present invention.

In the drawings, a device for the high-speed drilling of boards for printed circuits and the like is shown overall by the reference numeral 1. The device 1 comprises a support 2 on which a linear actuator 3 is mounted, whose rod 3a acts on a first carriage 4. The first carriage 4 is mounted to slide on the support 2 by guides 5 and shoes 6; a second carriage 8, which may also slide on the support 2 driven by a second actuator 3b, is mounted on different guides 7 and comprises similar shoes (not shown).

A drill head 11 is mounted on the first carriage 4 and comprises a mandrel 12 able to drive a drill bit 13 (see FIG. 2) in rotation at high speed. The actuator 3 displaces the first carriage 4 towards and away from a board P to be drilled during the desired drilling movements.

The second carriage 8, together with an arm 15 mounted thereon, is part of a workpiece-pressing device shown overall by the reference numeral 16 which is adapted to press the board P against a working surface (not shown) during drilling by the bit 13.

The arm 15 is embodied as a leaf spring extending in a cantilevered and projecting manner from a plate 17 which at the bottom closes an actuator member 18. The arm 15 is made in one piece with the plate 17 and ends at one of its roots in a weakened line 19a cut into the plate 17 which is adapted to create a preferential resiliently yielding zone about which the arm 15 tends to oscillate when actuated by the actuator member 18.

The actuator member 18 is preferably of the piezoelectric type and is adapted to promote the alternating oscillating movement of the arm 15 about the weakened line 19a. At the free end of the arm 15, opposite its root, there is formed a support 15c on which a pressure member 19 is mounted and is free to oscillate about a diametric axis 20 so as to be disposed coplanar to the board P when bearing thereon. The pressure member 19 is shaped as an annular bushing with a crown 21 of greater diameter and a crown 22 of smaller diameter which are coaxial and both provided with a central hole 23.

Figure 3:
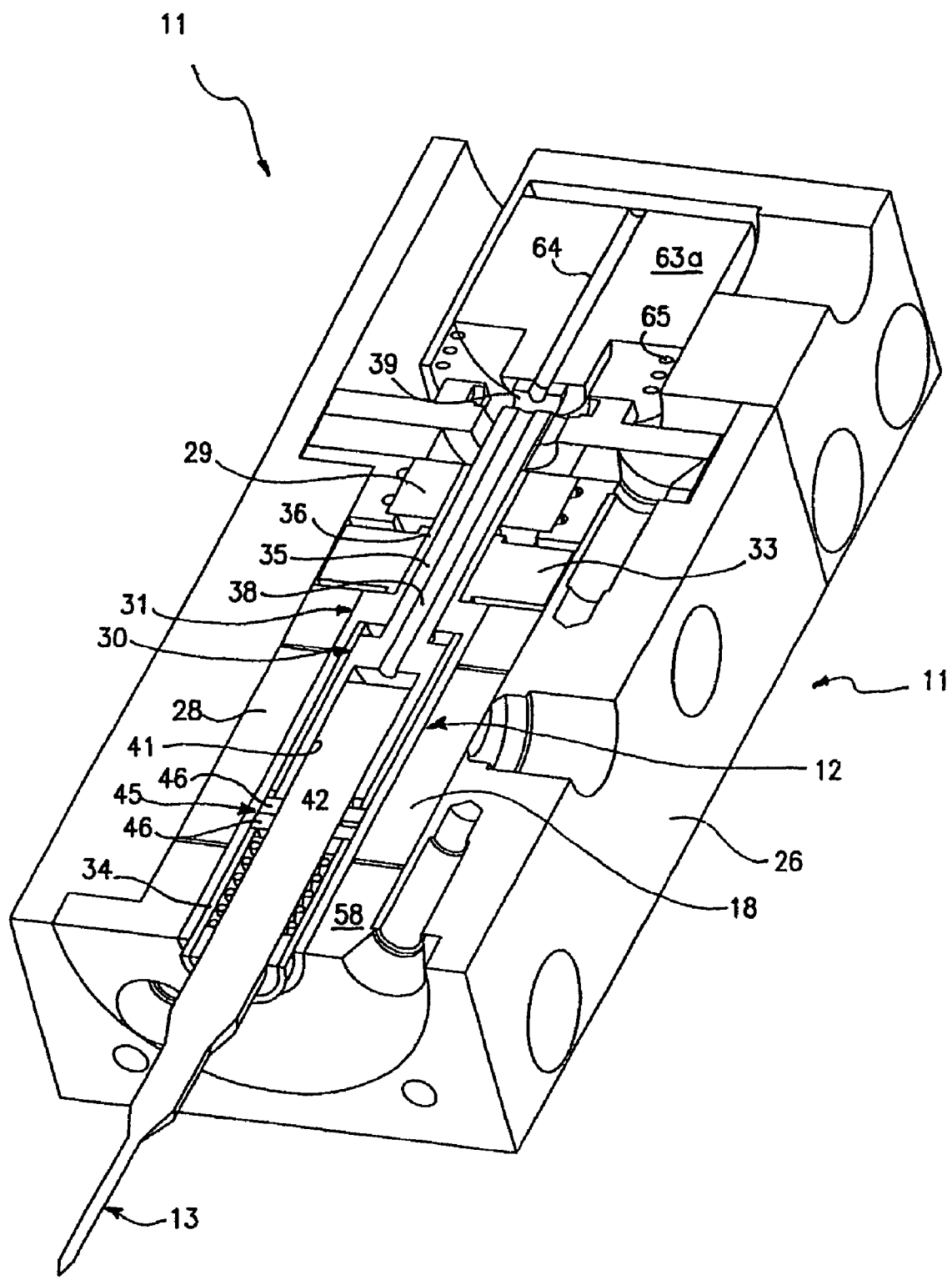
FIG. 3 is a perspective view, in longitudinal section, of a component of the device of FIG. 1.
Figure 4:
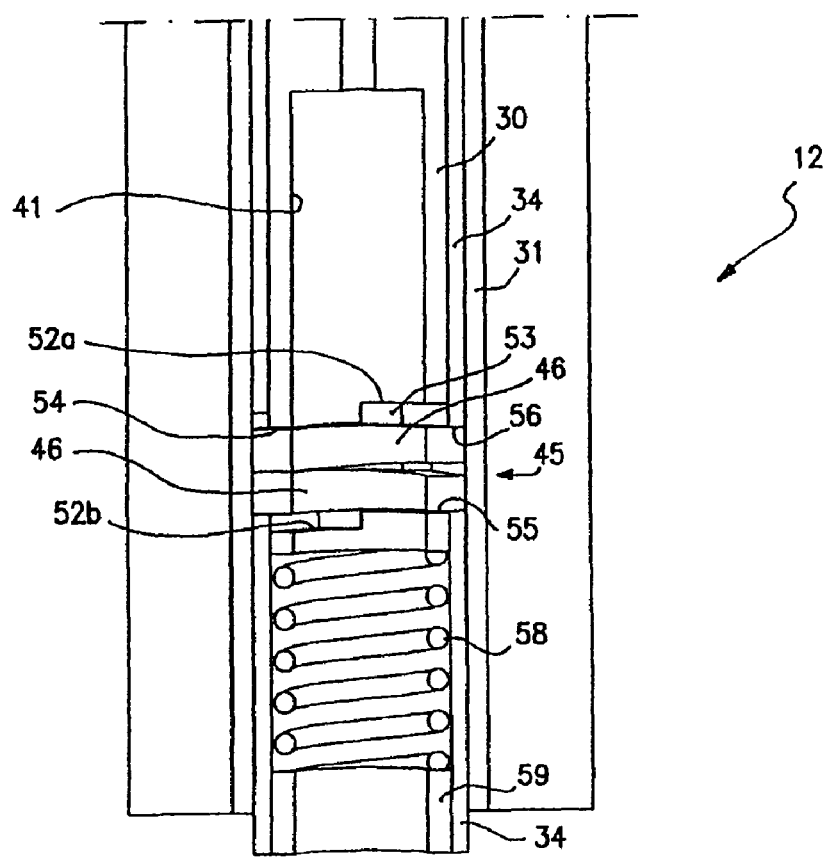
FIG. 4 is a sectional view, on an enlarged scale, of a detail of FIG. 3.

Turning to FIG. 3, the drill head 11 comprises a body 26 in which the mandrel 12 is supported by a fluidized bed bushing 28 and a bearing 29. The fluidized bed bushing 28 is of the type in which a sheet of compressed air is established between the cylindrical outer jacket of the mandrel 12 and the inner jacket of the bushing 28 which faces it and is adapted to center and radially support the mandrel 12; the bearing 29 is, however, a bearing adapted substantially to resist both the axial and the radial loads resulting from the drilling action.

As an alternative to the fluidized bed bushing 28, use may be made of a conventional rolling bearing or at least three bearings disposed at 120° with respect to one another, with an inner race keyed on respective fixed pins parallel to the axis of the mandrel 12 and an outer race in rolling contact with the mandrel 12.

The mandrel 12 in turn comprises an innermost core shaft 30, a sleeve 31 keyed thereon and on which the rotor of a compressed-air turbine 33 is keyed, and a tubular member 34 interposed between the outer jacket of the core shaft 30 and the inner jacket of the sleeve 31 in the section of larger diameter of both.

The core shaft 30 and the sleeve 31 both comprise respective tangs 35, 36 which are coaxial and keyed on one another. The turbine 33 and one of the races of the bearing 29 are keyed on the tang 36. The tang 35, in turn, comprises an axial hole 38 and a diametric hole 39, the latter being disposed at the free end of the tang 35.

The axial hole 38 is adapted to convey compressed cooling air to the drill bit 13; the diametric hole 39 is part of an optical encoder 40 (see FIG. 7) monitoring the speed of rotation of the mandrel 12. The signal generated by the encoder 40 is supplied to a control circuit 61 which drives a proportional valve 62 disposed on the duct 63 supplying compressed air to the turbine 33 so that there is a feedback signal which governs the control of the speed of rotation of the turbine 33 and therefore control of the drilling speed.

Figure 6:
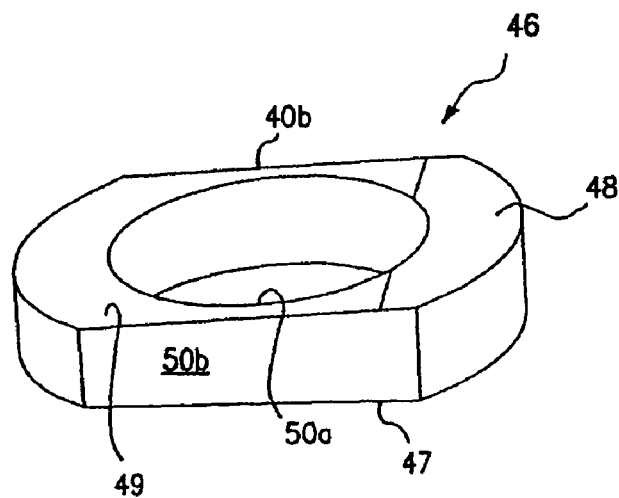
FIG. 6 is a perspective view of a further detail of the device of FIG. 3.

The core shaft 30 of the mandrel 12 in turn comprises an axial cavity 41 in its zone of greater diameter adapted to receive a tang 42 of the drill bit 13; the tang 42 is automatically held and locked in rotation in the cavity 41 by a locking and driving member shown overall by the reference numeral 45 and comprising a pair of rings 46 each having a planar surface 47 and an opposing surface having a planar section 48 and an inclined planar section 49, convergent towards the planar surface 47 from the planar section 48; the rings 46 have a central hole 50a in which the tang 42 of the bit 13 is engaged with a very small play and comprise opposing leveled sections 40b, 50b on the outer jacket. See FIG. 6.

The locking and driving member 45 further comprises a seat 51 for the rings 46 obtained at the free end of the core shaft 30 and comprising two juxtaposed annular formations 52a, 52b facing one another and interconnected by respective leveled parts 53 and having respective shoulders 54, 55 projecting in a stepped manner towards one another but offset diametrically, e.g., by 180°. Correspondingly, facing windows 56 are provided in the tubular member 34 in which the parts of the outer jacket portions of the rings 46 not comprising the leveled sections 40b, 50b are housed.

The windows 56 have an axial amplitude such as to contain the axial bulk of the rings 46 when bearing on one another with the respective planar sections 48, leaving, on the side corresponding to these planar sections 48, an axial play such that the rings 46 are compressed between the shoulder 54 and the opposing base of the corresponding window 56. A spring 58 held by a bushing 59 and pressing on the free end of the core shaft 30 completes the locking and driving member 45.

The bushing 59 is force-fitted in the tubular member 34 or made integral therewith. A piston 63a acts on command on the tang 35 in order to press the core shaft 30 in opposition to the spring 58 when it is desired to remove or insert the bit 13. The piston 63a is resiliently retracted into the position remote from the core shaft 30, in order to enable its free rotation, by a spring 65.

When the tang 42 of the bit 13 is first inserted into the bushing 59 and then into the axial cavity 41 of the core shaft 30, passing through the hole 50a in the rings 46 until reaching the desired extent, the piston 63a presses the core shaft 30 so as to compress the rings 46, with the respective planar sections 48 facing one another, into mutual contact.

When the action of the piston 63a is released, the spring 58 exerts a force on the rings 46, via the core shaft 30, so that they tend to be inclined in their respective seats towards a mutual meshing of the inclined planar sections 49. This entails an abutment on one side (hole 50a) with the tang 42 which is thus locked and on the other side with the inner jacket of the sleeve 31. This makes the bit 13 rigid with the mandrel 12 and with the turbine 33 associated therewith.

In contrast, by actuating the piston 63a to press the core shaft 30 in opposition to the spring 58, the above-mentioned locking action is released for the insertion and/or removal of the bit 13.

The piston 63a is preferably also provided with a passage 64 for the compressed air adapted to cool the tang 42 of the bit 13 and to clean (by blowing) the relative seat when the bit 13 is removed. The compressed air is for this purpose cooled by a Peltier cell cooling device (not shown).

The invention thus resolves the problem set out above and offers many advantages with respect to the technical solutions known up to now, all focusing chiefly on increasing the drilling speed and the hourly output that can be achieved. Among other advantages, the following are noted:

the bit 13 is less eccentric as the whole of its tang 42 is guided;

the working life of the bit 13 is increased and breakages are reduced because it is heated to a lower extent and is less eccentric;

the speed of penetration into the material of the printed circuit board P is higher as a result of the higher speed of rotation of the bit 13;

no maintenance of the locking system of the bit 13 is required; and a higher speed of replacement of drill bits 13 following breakages and/or wear of the cutting surfaces is achieved.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

The invention claimed is:

1. A device using a drill bit for the high-speed drilling of boards for printed circuits comprising:
   a support;
   a drill head mounted on the support with (a) an associated mandrel having a core shaft with a free end and a first tang, and a tubular member with facing windows each having a base, and (b) a member for locking and driving in the mandrel a drill bit having a second tang, the member including:
   (i) a pair of rings each having outer jacket portions received in the tubular member and a planar surface and an opposing surface having a planar section and an inclined planar section and a central hole adapted to receive the second tang of the drill bit, and
   (ii) a seat for the rings obtained at the free end of the core shaft of the mandrel and comprising two juxtaposed annular formations facing one another and interconnected by respective leveled portions and having respective shoulders projecting in a stepped manner towards one another but offset diametrically,
   wherein the windows have an axial amplitude such as to contain the axial bulk of the rings when bearing on one another with the respective planar sections, leaving, on the side corresponding to these planar sections, an axial play such that the rings are compressed between the shoulder and the opposing base of the corresponding window;
   a compressed air turbine having a rotor, actuating the mandrel, and rotating to define the drilling speed;
   an optical encoder for encoding the speed of rotation of the turbine and generating a signal representing this speed; and
   a control circuit receiving the signal from the optical encoder and driving a proportional valve, the proportional valve supplying compressed air to the turbine as a function of the speed of rotation encoded by the optical encoder.

2. A device for the high-speed drilling of boards for printed circuits comprising:
   a support;
   a drill head mounted on the support with (a) an associated mandrel having a core shaft with a free end and a first tang, and a tubular member with facing windows each having a base, and (b) a member for locking and driving in the mandrel a drill bit having a second tang, the member including:
   (i) a pair of rings each having outer jacket portions received in the tubular member and a planar surface and an opposing surface having a planar section and an inclined planar section and a central hole adapted to receive the second tang of the drill bit, and
   (ii) a seat for the rings obtained at the free end of the core shaft of the mandrel and comprising two juxtaposed annular formations facing one another and interconnected by respective leveled portions and having respective shoulders projecting in a stepped manner towards one another but offset diametrically,
   wherein the windows have an axial amplitude such as to contain the axial bulk of the rings when bearing on one another with the respective planar sections, leaving, on the side corresponding to these planar sections, an axial play such that the rings are compressed between the shoulder and the opposing base of the corresponding window.

3. The device for the high-speed drilling of boards for printed circuits according to claim 2, further comprising a spring pressing on the free end of the core shaft.

4. The device for the high-speed drilling of boards for printed circuits according to claim 3, further comprising a bushing holding the spring and being force-fitted into the tubular member or made in one piece therewith.

5. The device for the high-speed drilling of boards for printed circuits according to claim 4, further comprising a piston acting on command on the first tang of the core shaft in order to press the core shaft in opposition to the spring when it is desired to remove or insert the drill bit.

6. The device for the high-speed drilling of boards for printed circuits according to claim 5, wherein the piston is provided with at least one passage adapted to deliver compressed air to cool the drill bit and to clean the seat when the bit is removed.

7. The device for the high-speed drilling of boards for printed circuits according to claim 2, further comprising a compressed air turbine having a rotor and wherein the mandrel further comprises a sleeve keyed on the core shaft and on which the rotor of the compressed air turbine is keyed, and wherein the tubular member is interposed between the outer jacket of the core shaft and the inner jacket of the sleeve in the section of greater diameter of both.

8. The device for the high-speed drilling of boards for printed circuits according to claim 7, wherein the sleeve has a third tang which is coaxial with and keyed on the first tang of the core shaft, the turbine is keyed on the third tang of the sleeve, and the first tang of the core shaft is provided with an axial hole adapted to convey compressed cooling air to the drill bit.

9. The device for the high-speed drilling of boards for printed circuits according to claim 2, further comprising an optical encoder monitoring the speed of rotation of the mandrel and wherein the first tang has a diametric hole forming part of the encoder.

10. The device for the high-speed drilling of boards for printed circuits according to claim 1, further comprising a spring pressing on the free end of the core shaft, wherein the first tang has a diametric hole forming part of the optical encoder, and wherein the mandrel further comprises a sleeve keyed on the core shaft and on which the rotor of the compressed air turbine is keyed, and wherein the tubular member is interposed between the outer jacket of the core shaft and the inner jacket of the sleeve in the section of greater diameter of both.

11. The device for the high-speed drilling of boards for printed circuits according to claim 1, further comprising a spring pressing on the free end of the core shaft.

12. The device for the high-speed drilling of boards for printed circuits according to claim 11, further comprising a bushing holding the spring and being force-fitted into the tubular member or made in one piece therewith.

13. The device for the high-speed drilling of boards for printed circuits according to claim 12, further comprising a piston acting on command on the first tang of the core shaft in order to press the core shaft in opposition to the spring when it is desired to remove or insert the drill bit.

14. The device for the high-speed drilling of boards for printed circuits according to claim 13, wherein the piston is provided with at least one passage adapted to deliver compressed air to cool the drill bit and to clean the seat when the bit is removed.

15. The device for the high-speed drilling of boards for printed circuits according to claim 1, wherein the mandrel further comprises a sleeve keyed on the core shaft and on which the rotor of the compressed air turbine is keyed, and wherein the tubular member is interposed between the outer jacket of the core shaft and the inner jacket of the sleeve in the section of greater diameter of both.

16. The device for the high-speed drilling of boards for printed circuits according to claim 15, wherein the sleeve has a third tang which is coaxial with and keyed on the first tang of the core shaft, the turbine is keyed on the third tang of the sleeve, and the first tang of the core shaft is provided with an axial hole adapted to convey compressed cooling air to the drill bit.

17. The device for the high-speed drilling of boards for printed circuits according to claim 1, wherein the first tang has a diametric hole forming part of the optical encoder.

18. The device for the high-speed drilling of boards for printed circuits according to claim 10, further comprising:
 a bushing holding the spring and being force-fitted into the tubular member or made in one piece therewith; and
 a piston acting on command on the first tang of the core shaft in order to press the core shaft in opposition to the spring when it is desired to remove or insert the drill bit, the piston having at least one passage adapted to deliver compressed air to cool the drill bit and to clean the seat when the bit is removed.

19. The device for the high-speed drilling of boards for printed circuits according to claim 18, wherein the sleeve has a third tang which is coaxial with and keyed on the first tang of the core shaft, the turbine is keyed on the third tang of the sleeve, and the first tang of the core shaft is provided with an axial hole adapted to convey compressed cooling air to the drill bit.

* * * * *